(12) United States Patent
Hoyerby et al.

(10) Patent No.: US 8,090,051 B2
(45) Date of Patent: Jan. 3, 2012

(54) COMBINED FEEDBACK AND FEED-FORWARD LINEARIZATION OF RADIO FREQUENCY (RF) POWER AMPLIFIERS

(75) Inventors: Mikkel Christian Wendelboe Hoyerby, Copenhagen (DK); Niels-Henrik Lai Hansen, Frederiksberg (DK)

(73) Assignee: Motorola Solutions, Inc., Schaumburg, IL (US)

(*) Notice: Subject to any disclaimer, the term of this patent is extended or adjusted under 35 U.S.C. 154(b) by 918 days.

(21) Appl. No.: 12/111,593

(22) Filed: Apr. 29, 2008

(65) Prior Publication Data

US 2009/0267688 A1 Oct. 29, 2009

(51) Int. Cl.
*H04K 1/02* (2006.01)
(52) U.S. Cl. ....................................... 375/297
(58) Field of Classification Search .................... 375/297
See application file for complete search history.

(56) References Cited

U.S. PATENT DOCUMENTS

| | | | | |
|---|---|---|---|---|
| 4,453,133 A * | 6/1984 | Travis | | 330/149 |
| 5,420,536 A * | 5/1995 | Faulkner et al. | | 330/149 |
| 5,867,065 A * | 2/1999 | Leyendecker | | 330/149 |
| 6,043,707 A | 3/2000 | Budnik | | |
| 6,054,894 A * | 4/2000 | Wright et al. | | 330/149 |
| 6,240,144 B1 * | 5/2001 | Ha | | 375/297 |
| 6,445,249 B1 * | 9/2002 | Khan et al. | | 330/149 |
| 6,642,786 B1 | 11/2003 | Jin | | |
| 2002/0058486 A1 * | 5/2002 | Persson | | 455/150.1 |
| 2003/0053552 A1 * | 3/2003 | Hongo et al. | | 375/295 |
| 2004/0137856 A1 | 7/2004 | Kanazawa | | |
| 2004/0166813 A1 * | 8/2004 | Mann et al. | | 455/69 |
| 2004/0237007 A1 | 11/2004 | Busking | | |
| 2005/0123064 A1 * | 6/2005 | Ben-Ayun et al. | | 375/295 |
| 2005/0157814 A1 | 7/2005 | Cova | | |

FOREIGN PATENT DOCUMENTS

| | | |
|---|---|---|
| GB | 338130 | 5/1929 |
| GB | 2368214 A | 4/2002 |

(Continued)

OTHER PUBLICATIONS

Kim, "Adaptive Compensation for Power Amplifier Nonlinearity in the Presence of Quadrature Modulation/Demodulation Errors," IEEE Transactions on Signal Processing, Issue Date: Sep. 2007 vol. 55 Issue: 9 on pp. 4717-4721.*

Woo, "Adaptive Digital Feedback Predistortion Technique for Linearizing Power Amplifiers," IEEE Transactions on Microwave Theory and Techniques, vol. 55, No. 5, May 2007.*

(Continued)

*Primary Examiner* — Juan A Torres
(74) *Attorney, Agent, or Firm* — Anthony P. Curtis; Daniel R. Bestor

(57) ABSTRACT

A power amplifier module and corresponding system for linearizing the output from a power amplifier includes both a feedback system, containing a compensator and the power amplifier in a feedback loop, and a pre-distortion compensation system injecting pre-distortion signals into or before the feedback system are used to compensate for non-linearities in the overall system. The pre-distortion signals may be mixed with signals from the compensator or may be filtered to take into account the loop compensator transfer function of the feedback loop, mixed with baseband signals and then converted into analog signals that are provided to the feedback loop. In modules containing a tracking power supply, an envelope calculator calculates an RF envelope of the baseband signals, which the pre-distortion system uses in conjunction with the baseband signals to generate the pre-distortion signals mixed with the signals from the compensator.

17 Claims, 7 Drawing Sheets

FOREIGN PATENT DOCUMENTS

| | | |
|---|---|---|
| GB | 2408860 A | 8/2005 |
| GB | 332996 | 4/2008 |
| WO | WO9318602 | 9/1993 |
| WO | WO0124356 A1 | 4/2001 |
| WO | WO02067445 A1 | 8/2002 |

OTHER PUBLICATIONS

Zhao, "Error Analysis and Compensation Algorithm for Digital Predistortion Systems," Piers online vol. 2 No. 6 2006 pp. 702-705.*
International Search Report Dated Sep. 23, 2009.

* cited by examiner

COMBINED FEEDBACK AND FEED-FORWARD LINEARIZATION OF RADIO FREQUENCY (RF) POWER AMPLIFIERS

TECHNICAL FIELD

The present application relates to radio frequency (RF) power amplifiers. In particular, the application relates to the linearization of RF power amplifiers.

BACKGROUND

In many types of electronic applications, especially those that contain power amplifiers, signal distortion plays a significant role. One particular application in which a power amplifier is used is a communication system, in which the power amplifier is used to increase the signal strength of wireless transmissions between a base station and a wireless handset. In an ideal linear power amplifier, the ratio of the output power to the input power does not vary with the input power. However, communications systems are not ideal. Thus, the power amplifier is subject to nonlinearities that add noise and cause distortion.

There exist different techniques for improving linearization of power amplifiers over different power levels. One of these techniques uses digital pre-distortion. A pre-distortion system generally relies on a priori knowledge of the power amplifier characteristics to digitally pre-compensate for the power amplifier distortion. The signal is corrected prior to being upconverted to radio frequency. The pre-distortion tables can be generated and implemented in a variety of known ways. The values in the tables modify the signal to using the inverse characteristics of the power amplifier. However, to use this technique, the power amplifier distortion characteristics must be known in advance to provide suitable linearization.

Another of these linearization techniques uses feedback. Using feedback linearization, the power amplifier is enclosed within a Cartesian feedback system. Pre- and post-amplification signals are combined to generate a corrected signal. While this approach does not rely on advance knowledge of the power amplifier distortion characteristics, it may be costly to implement. The pre-distortion and Cartesian feedback approaches are fundamentally different and not directly compatible. For example, feeding a closed Cartesian loop with the pre-distorted input that would be used in a basic pre-distortion system would produce gross distortion since the Cartesian loop now tries to reproduce a reference signal with considerable added distortion. Placing the pre-distortion system within the Cartesian loop is also undesirable since the pre-distortion system is best implemented digitally, leading to a significant amount of processing delay, compromising the stability of the Cartesian feedback system. Thus, only one has been applied to a given system at a time. In some instances, the linearization provided by each technique alone has not been sufficient. It is thus desirable to provide an enhanced linearization technique.

BRIEF DESCRIPTION OF THE DRAWINGS

Embodiments will now be described by way of example with reference to the accompanying drawings, in which.

DETAILED DESCRIPTION

A linear power amplifier module and corresponding linearization system is provided for a radio frequency (RF) power amplifier. The linear power amplifier module may be used in radio transmitters of various types, for example, those present in base stations or handsets. The combined pre-distortion and feedback compensation system provides the simultaneous benefits of both linearization mechanisms. Estimated I and Q error signals are generated and then injected into or before an analog feedback loop so that the error is primarily compensated for directly using known or estimated characteristics of the power amplifier. This effectively lowers the open-loop distortion of the power amplifier, thereby decreasing the closed-loop distortion when a feedback signal is applied. The power amplifier module and method of linearization uses a combination of feedback-based linearization with pre-distortion/error feed-forward, where the error feed-forward is generated digitally and injected such that there is no conflict between the feedback and feed-forward error correction functions.

Figure 1:
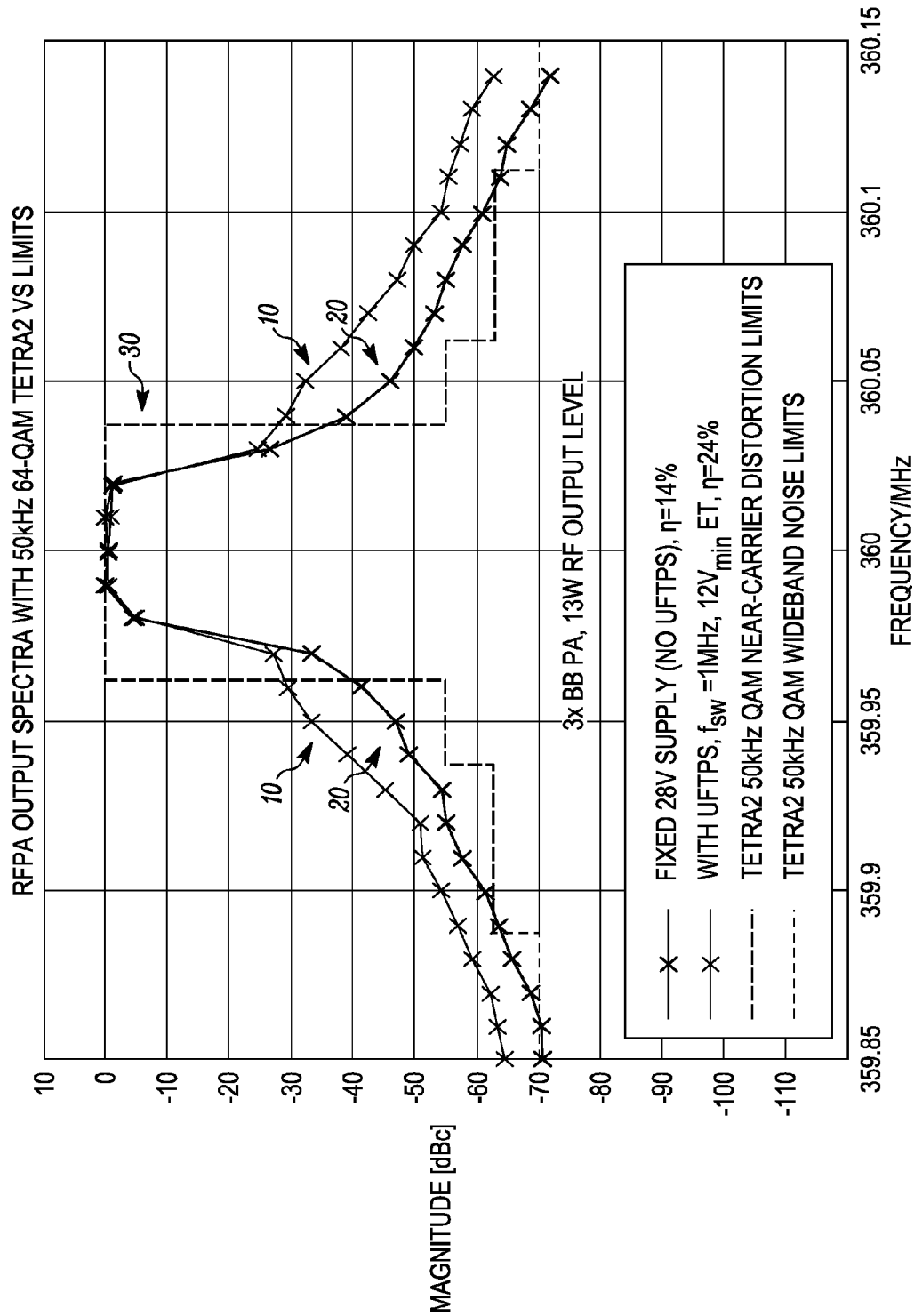
FIG. 1 is a graph of output signal for a power supply with and without power supply modulation.

As indicated above, known techniques may not be sufficient to linearize current power amplifier modules. In one particular example, the incorporation of power supply modulation in a power amplifier module adds a substantial amount of non-linearity. Power supply modulation is used to control the supply voltage provided to the power amplifier to correspond to the instantaneous output power level. Such a scheme maximizes the efficiency of the power amplifier. For implementing power supply modulation, an Ultra-Fast Tracking Power Supply (UFTPS) is used to generate a rapidly-varying voltage to supply to the power amplifier. The power consumption of the power amplifier is reduced by using such a variable supply voltage. However, use of the UFTPS introduces a significant amount of extra distortion at the output of the power amplifier throughout the output signal spectrum. This is shown in the graph of FIG. 1, which illustrates the output spectra of a 50 kHz input signal for a high-power power supply used in the current generation of Tetra base station. An ideal output (30) is shown, along with a measured output using power supply modulation (10) and not using power supply modulation (20). The modulation increases efficiency by 10% but also generates an extra 10 dB of distortion near the carrier. The existing linearization techniques used alone are not able to adequately compensate for UFTPS systems.

Figure 2:
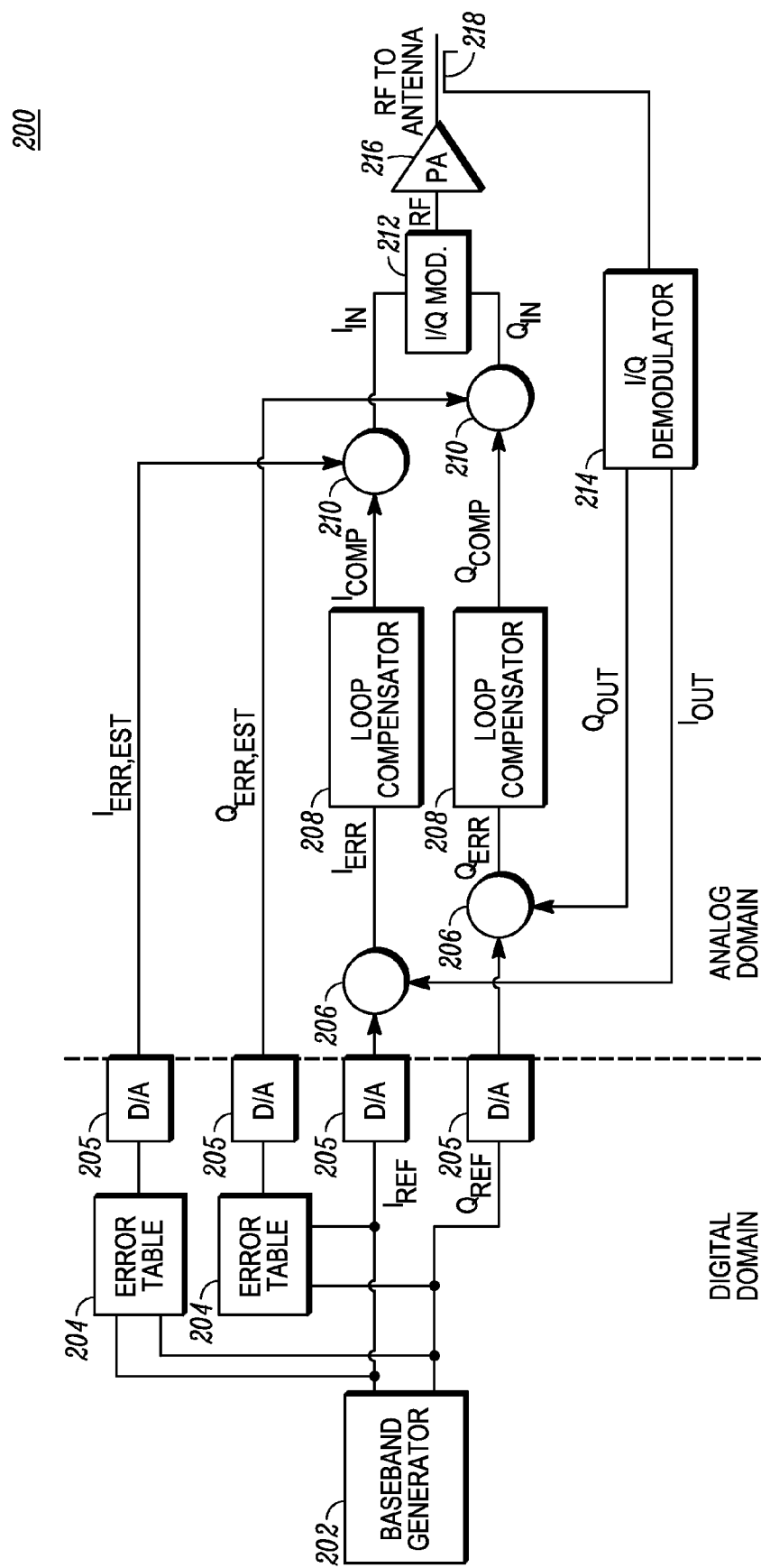
FIG. 2 is a first embodiment of a power amplifier module.

FIG. 2 illustrates one embodiment of the linear power amplifier module. In FIG. 2, the feed-forward error correction signals are digitally calculated and injected after the feedback loop compensator. This reduces the distortion of the RF power amplifier before the feedback linearization is applied, thereby reducing the amount of correction compensated for by the feedback loop.

Specifically, the linear power amplifier module 200 in FIG. 2 contains a baseband generator 202, error tables 204, D/A converters 205, first combiners 206, loop compensator 208, second combiners 210, an I/Q modulator 212, an I/Q demodulator 214, and a power amplifier 216. The baseband generator 202 and error tables 204 operate in the digital domain, while the first combiners 206, loop compensators 208, second combiners 210, I/Q modulator 212, I/Q modulator 214, and power amplifier 216 operate in the analog domain.

The baseband generator 202 generates a digital quadrature-amplitude modulated (QAM) signal. The output of the baseband generator 202, a pair of quadrature reference signals, $I_{ref}$ and $Q_{ref}$, are supplied to each error table 204. The error tables 204 generate estimations of the error signals $I_{err,\ est}$, $Q_{err,\ est}$ for the quadrature reference signals $I_{ref}$, $Q_{ref}$. The estimated error signals $I_{err,\ est}$, $Q_{err,\ est}$ are generated by means of a lookup table. The error tables 204 provide a portion of the error correction in the power amplifier module 200 by providing a stored scalar that compensates for the power amplifier non-linearity. The scalar is predetermined, e.g., using the value determined or estimated by the power amplifier manufacturer or using a training sequence in the factory, to determine the initial non-linearity of the power amplifier 216. A digital-to-analog converter 205 converts each of the quadrature reference signals $I_{ref}$, $Q_{ref}$ and the estimated error signals $I_{err,est}$, $Q_{err,est}$ from a digital signal into an analog signal. As shown, four D/A converters 205 are used in total. The signals passing through the D/A converters 205 are pre-compensated such that the group delay of all signals that pass through D/A converters 205 are same. Filters associated with the D/A converters 205 are not shown. A filter (not shown) can also be placed in the digital domain (i.e., in FIG. 2 to the left of the D/A converters 205) to filter the signals from the error table.

Each of the quadrature reference signals $I_{ref}$, $Q_{ref}$ is also supplied to a different first combiner 206. The first combiner 206 combines the quadrature reference signals $I_{ref}$, $Q_{ref}$ with quadrature feedback signals $I_{out}$, $Q_{out}$ to form error signals $I_{err}$, $Q_{err}$. In a power modulator system with perfect error correction, the error signals $I_{err}$, $Q_{err}$ would be non-existent. The error signals $I_{err}$, $Q_{err}$ are individually provided to a loop compensator 208, that shapes the loop gain of the system. The error suppression of the loop compensator 208 is frequency dependent such that a larger amount of error suppression by the loop compensator 208 is provided at lower frequencies, less at higher frequencies. Each of the compensated signals $I_{comp}$, $Q_{comp}$ is then combined with the corresponding estimated error signal $I_{err,\ est}$, $Q_{err,\ est}$ at the second combiner 210 to form modulator input signals $I_{in}$, $Q_{in}$. The modulator input signals $I_{in}$, $Q_{out}$, which are at the baseband frequency, are then supplied to a modulator 212. The modulator 212 combines the modulator input signals $I_{in}$, $Q_{in}$ into a single signal and modulates the signal at the desired RF frequency. The RF signal is supplied to a power amplifier 216 and then the amplified RF signal is supplied to an antenna. The amplified RF signal is sampled by a coupler 218 and the sampled signal is demodulated by the demodulator 214. The demodulator 214 generates the quadrature feedback signals $I_{out}$, $Q_{out}$ baseband, which are then supplied to the first combiners 206.

As above, in this embodiment, the feed-forward error correction signals ($I_{err,\ est}$, $Q_{err,\ est}$) are digitally calculated, turned into an analog signal, and injected after the feedback loop compensator 208. As a portion of the correction for the power amplifier module 200 occurs due to the injected correction signals, the amount of correction that the feedback loop is to supply is correspondingly decreased.

Figure 3:
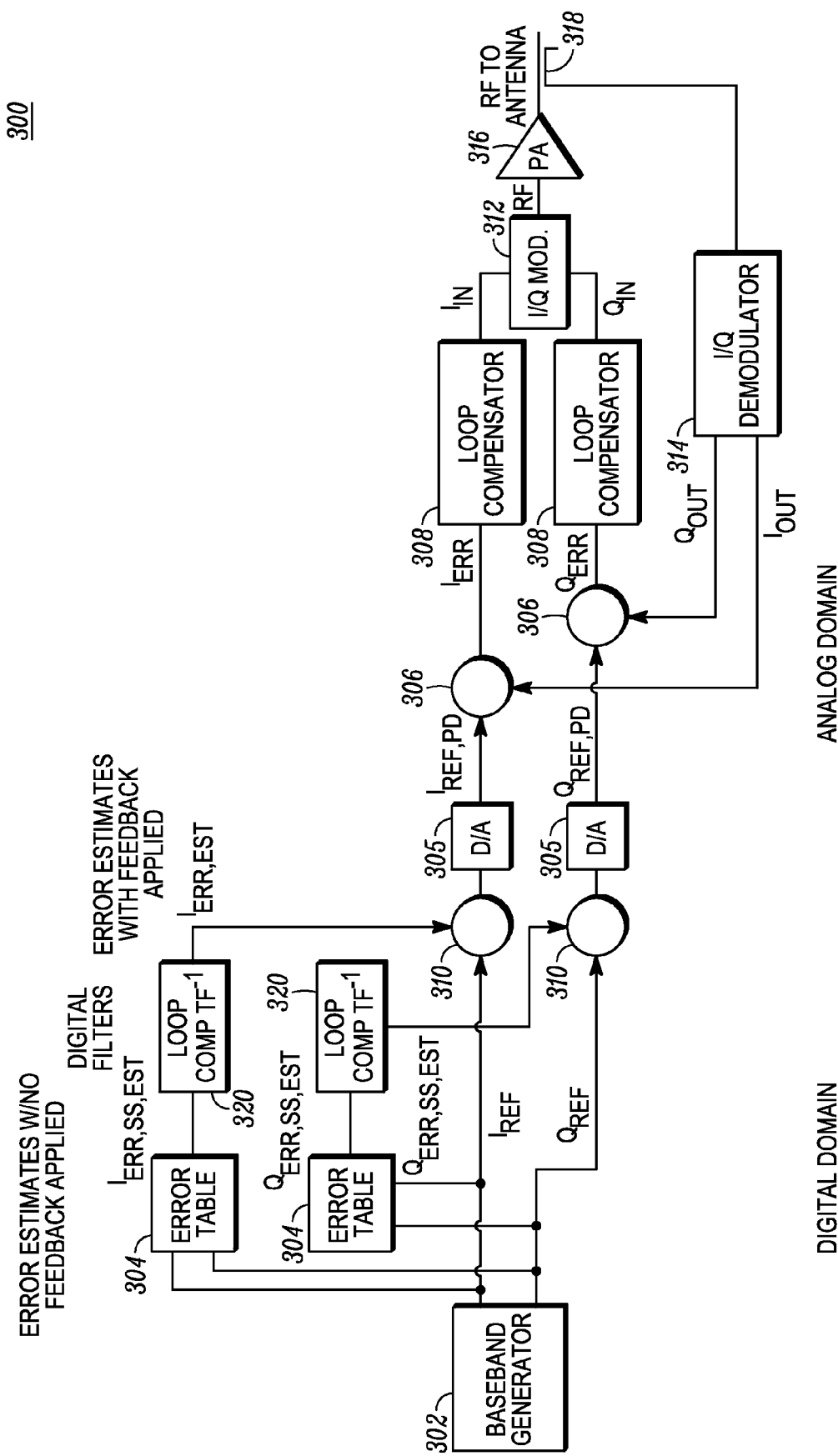
FIG. 3 is a second embodiment of a power amplifier module.

In another embodiment, illustrated in FIG. 3, the pre-distortion is applied in the digital domain. However, the errors generated by the power amplifier and reduced by the feedback loop are taken into account. This is accomplished by (in addition to knowing or estimating the power amplifier characteristics) inverting the loop compensator transfer function in order to provide a filter that pre-compensates for the power amplifier errors that are removed by the feedback loop.

Specifically, the linear power amplifier module 300 in FIG. 3 contains a baseband generator 302, error tables 304, D/A converters 305, filters 320, first combiners 306, loop compensator 308, second combiners 310, an I/Q modulator 312, an I/Q demodulator 314, and a power amplifier 316. The baseband generator 302, error tables 304, and filter 320 and second combiners 310 operate in the digital domain, while the first combiners 306, loop compensators 308, I/Q modulator 312, I/Q demodulator 314, and power amplifier 316 operate in the analog domain.

The baseband generator 302 generates a digital QAM signal. The output of the baseband generator 302, a pair of quadrature reference signals, $I_{ref}$ and $Q_{ref}$, are supplied to each error table 304. The error tables 304 generate estimations of the error signals $I_{err,\ SS\ est}$, $Q_{err,\ SS\ est}$ for the quadrature reference signals $I_{ref}$, $Q_{ref}$. The estimated error signals $I_{err,\ SS\ est}$, $Q_{err,\ SS\ est}$ are generated in a manner similar to the embodiment of FIG. 2. As described above, the estimated error signals $I_{err,\ SS\ est}$, $Q_{err,\ SS\ est}$ do not take into account the effects of the feedback loop. The error estimates are smaller but more uncertain and less robust than that of FIG. 2. One reason for this is because the loop compensator transfer function of the feedback system is typically known with some uncertainty. Additionally, since the loop compensator is generally an integrator-type element, error estimates will be high-pass filtered, increasing the amount of high-frequency energy in these signals. This generally makes it more difficult to accurately reproduce the I and Q references through an A to D converter. This may lead to more bits and/or a higher sampling rate being used in the D/A converters 305.

The estimated error signals $I_{err,\ SS\ est}$, $Q_{err,\ SS\ est}$ are then supplied to a digital filter 320. The filter 320 filters the estimated error signals $I_{err,\ SS\ est}$, $Q_{err,\ SS\ est}$ to take into account the feedback loop by providing the inverse loop compensator transfer function and form final estimate error signals $I_{err,\ est}$, $Q_{err,\ est}$. Each of the quadrature reference signals $I_{ref}$, $Q_{ref}$ is supplied to one of the second combiners 310, where it is combined with the corresponding final estimate error signal $I_{err,\ est}$, $Q_{err,\ est}$ and converted by a D/A converter 305 to produce an analog output reference signal $I_{ref,\ PD}$, $Q_{ref,\ PD}$. Unlike the embodiment of FIG. 2, in FIG. 3 only two D/A converters are used as there are only two digital signals to be converted to analog signals.

The analog output reference signals $I_{ref,\ PD}$, $Q_{ref,\ PD}$ are supplied to first combiners 306 where each is combined with the corresponding quadrature feedback signals $I_{out}$, $Q_{out}$ to form error signals $I_{err}$, $Q_{err}$. The error signals $I_{err}$, $Q_{err}$ are individually provided to a loop compensator 308 to form modulator input signals $I_{in}$, $Q_{out}$. The modulator input signals $I_{in}$, $Q_{out}$, which are at the baseband frequency, are then supplied to a modulator 312. The modulator 312 combines the modulator input signals $I_{in}$, $Q_{out}$ into a single signal and modulates this signal at the desired RF frequency. The RF output signal is supplied to a power amplifier 316 and then the amplified RF signal is supplied to an antenna (not shown). The amplified RF signal is sampled by a coupler 318 and the sampled signal is demodulated by the demodulator 314. The demodulator 314 generates the quadrature feedback signals $I_{out}$, $Q_{out}$, which are then supplied to the first combiners 306.

Figure 4:
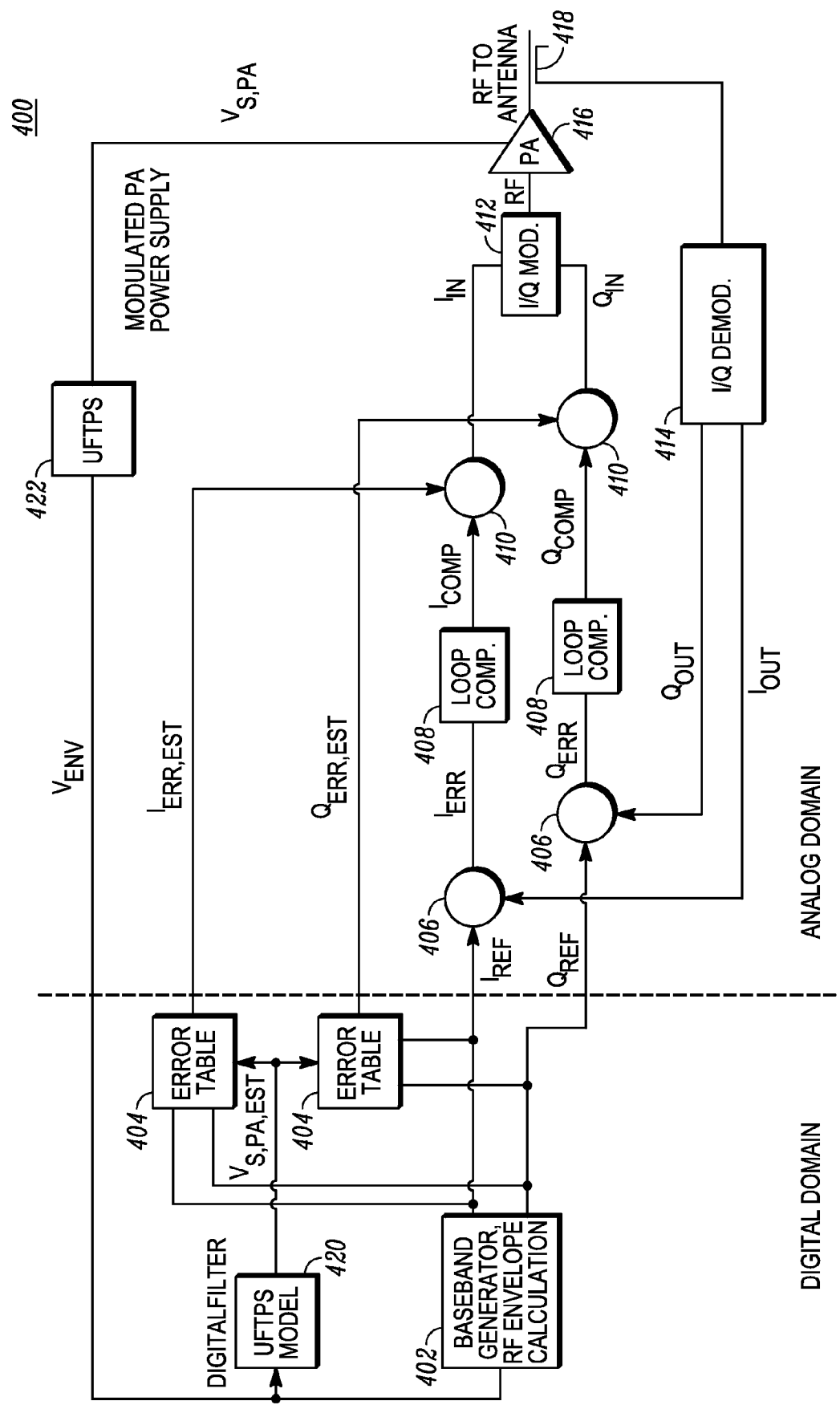
FIG. 4 is a third embodiment of a power amplifier module.

Another embodiment of a linear power amplifier module is shown in FIG. 4. In this embodiment, a UFTPS is incorporated into the error estimation system. Since the power amplifier supply voltage substantially influences the power amplifier behavior, estimating this at digital baseband level (using a digital filter for modeling UFTPS behavior) allow for more precise estimation of the open-loop I and Q errors generated by the PA.

Specifically, the linear power amplifier module 400 in FIG. 4 contains a baseband generator 402, error tables 404, first combiners 406, loop compensator 408, second combiners 410, an I/Q modulator 412, an I/Q demodulator 414, a power amplifier 416, a UFTPS model 420, and a UFTPS 422. The baseband generator 402, error tables 404, and UFTPS model 420 operate in the digital domain, while the first combiners 406, loop compensators 408, second combiners 410, I/Q modulator 412, I/Q modulator 414, power amplifier 416, and UFTPS 422 operate in the analog domain.

The baseband generator 402 generates a digital QAM signal. The baseband generator 402 calculates the RF envelope $V_{env}$, which is followed by the UFPTS 422 and filtered by the UFPTS model 420. As in FIG. 2, in the embodiment of FIG. 4, the output of the baseband generator 402, the quadrature reference signals, $I_{ref}$ and $Q_{ref}$, are supplied to each error table 404. The UFPTS model 420 also supplies a signal to each of the error tables 404. This signal is generated by the UFPTS model 420 filtering the digital RF envelope $V_{env}$. The error tables 404 generate estimations of the error signals $I_{err, est}$, $Q_{err, est}$ for the quadrature reference signals $I_{ref}$, $Q_{ref}$ based on both the quadrature reference signals, $I_{ref}$ and $Q_{ref}$ and the signals from the UFPTS model 420. As in other embodiments, D/A converters (not shown) convert each of the RF envelope $V_{env}$, the quadrature reference signals $I_{ref}$, $Q_{ref}$, and the estimated error signals $I_{err, est}$, $Q_{err, est}$ from a digital signal into an analog signal. The transition between analog and digital signals is shown in FIG. 4 as the dotted vertical line. Thus, in this embodiment, five D/A converters are used in total.

Each of the quadrature reference signals $I_{ref}$, $Q_{ref}$ is supplied to a different first combiner 406. The first combiner 406 combines the quadrature reference signals $I_{ref}$, $Q_{ref}$ with quadrature feedback signals $I_{out}$, $Q_{out}$ to form error signals $I_{err}$, $Q_{err}$. The error signals $I_{err}$, $Q_{err}$ are individually provided to a loop compensator 408. Each of the compensated signals $I_{comp}$, $Q_{comp}$ is then combined with the corresponding estimated error signal $I_{err, est}$, $Q_{err, est}$ at the second combiner 410 to form modulator input signals $I_{in}$, $Q_{in}$. The modulator input signals $I_{in}$, $Q_{in}$, which are at the baseband frequency, are then supplied to a modulator 412. The modulator 412 combines the modulator input signals $I_{in}$, $Q_{in}$ into a single signal and modulates the signal at the desired RF frequency.

The RF output signal from the modulator 412 is supplied to a power amplifier 416. The RF envelope $V_{env}$ is supplied to the UFPTS 422. The UFPTS 422 supplies a supply voltage $V_{s,PA}$ to the PA 416. This supply voltage $V_{s,PA}$ is dependent on the envelope of the reference signals $I_{ref}$, $Q_{ref}$. The amplification of the PA 416 is dependent on the supply voltage $V_{s,PA}$, and thus the amplified RF signal from the PA 416 is dependent on the supply voltage $V_{s,PA}$. The amplified RF signal from the PA 416 is then supplied to an antenna (not shown). The amplified RF signal is sampled by a coupler 418 and the sampled signal is demodulated by the demodulator 414. The demodulator 414 generates the quadrature feedback signals $I_{out}$, $Q_{out}$, which are then supplied to the first combiners 406.

As illustrated, in this embodiment, the UFTPS is incorporated into the error estimation system. The UFTPS may also be incorporated into the error estimation system shown in FIG. 4. Since the power amplifier supply voltage substantially influences the power amplifier behavior, estimating this behavior at the digital baseband level (using a digital filter for modeling the UFTPS behavior) allows for more precise estimation of the open-loop I and Q errors generated by the power amplifier.

Figure 5:
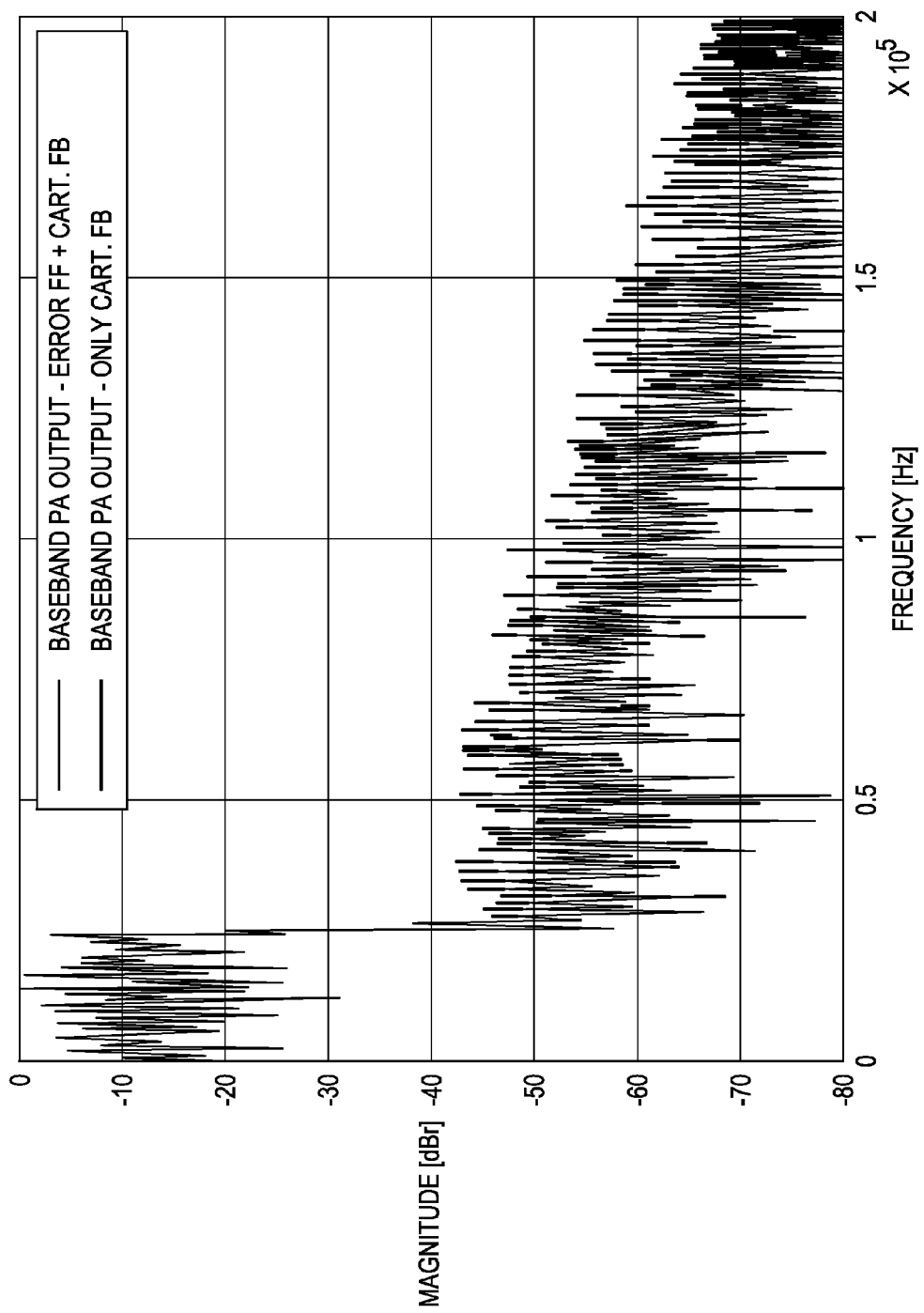
FIG. 5 is a simulation of non-modulated outputs of the power amplifier module of FIG. 2 and a power amplifier module with only feedback compensation.
Figure 6:
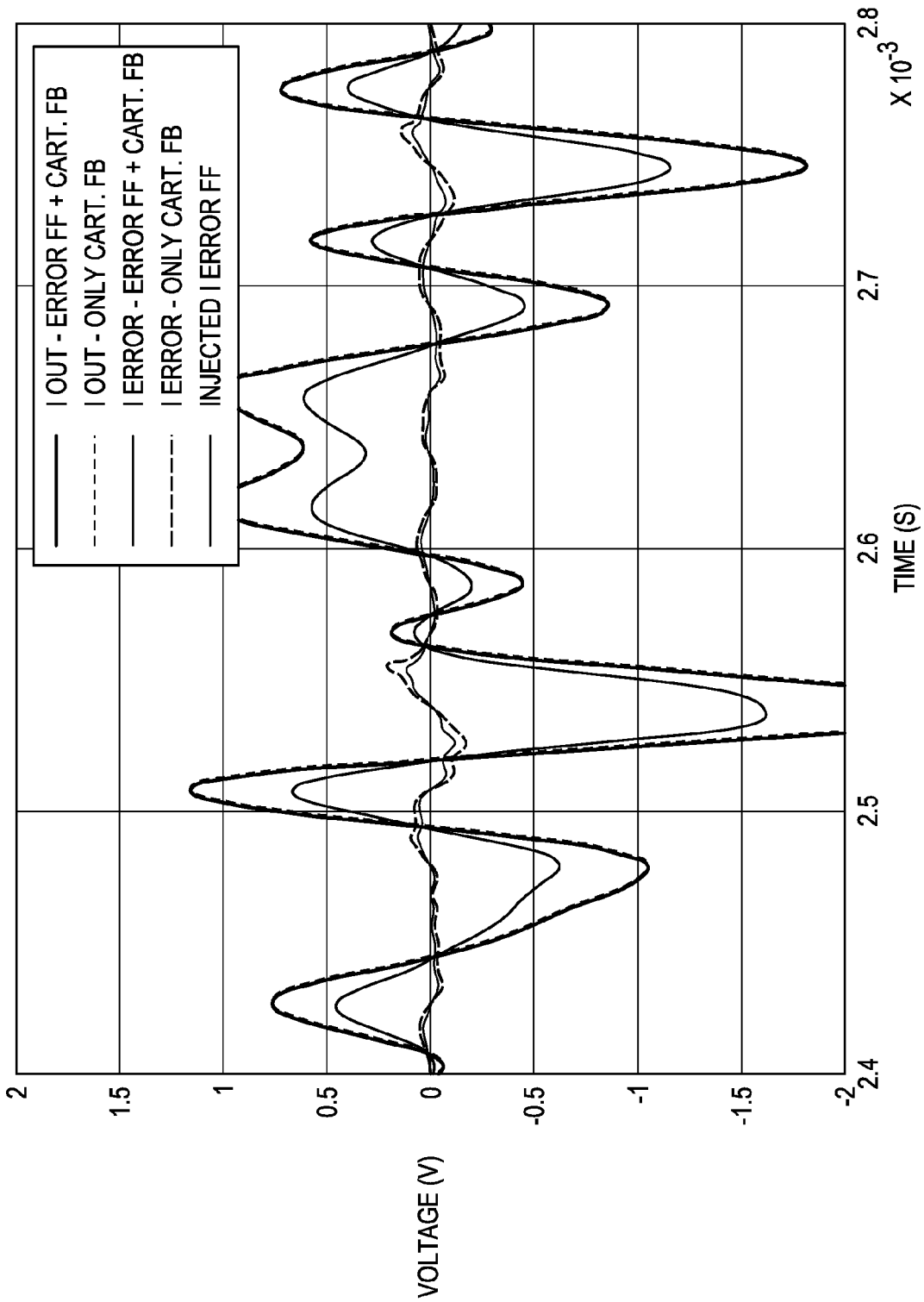
FIG. 6 is a simulation of non-modulated I components of the power amplifier modules of FIG. 5.
Figure 7:
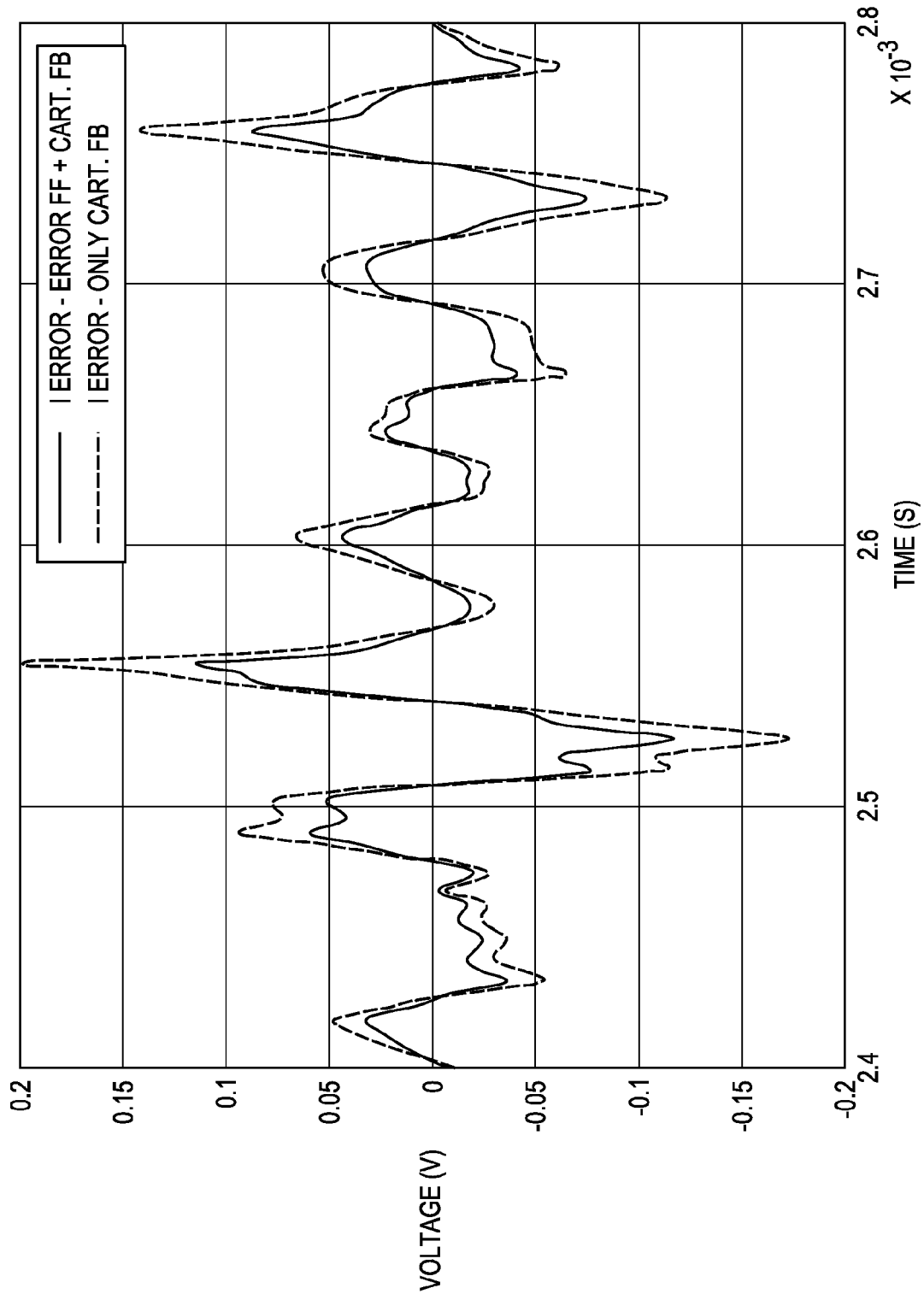
FIG. 7 is an enhanced view of the I component error signals shown in FIG. 5.

This is shown in the simulations shown in FIGS. 5-7. These figures illustrate various outputs for the power amplifier module shown in FIG. 2 and a power amplifier module that has feedback compensation but not pre-distortion compensation. The signals in the power amplifier module have not been simulated to be modulated by the I/Q modulator 212 or demodulated by the I/Q demodulator 214. As can be seen, for frequencies relatively close (e.g., about 30-50 kHz) to the baseband frequency the combination of the compensation techniques results in about a 3 dB improvement over the use of feedback compensation alone. For frequencies farther away (e.g., over about 150 kHz), the combination of the compensation techniques results in about a 6 dB improvement over the use of feedback compensation alone.

Turning to FIG. 6, the individual I components in the power amplifier module have been simulated and shown in a plot of voltage (in V) vs. time (in s). Specifically, the output I component from the coupler 218 ($I_{out}$) and the I error component from the first combiner 206 ($I_{err}$) for both power amplifier modules and the analog I estimated error ($I_{est, err}$) from the error table 204 for the power amplifier module containing predistortion compensation are shown. As can be seen in FIG. 6, the difference between the output signals ($I_{out}$) is relatively small and not easily seen on the voltage scale provided for the y-axis. Even on the scale in FIG. 6, it is clear that the actual error signal ($I_{err}$) supplied to the loop compensator 208 is different between the power amplifier modules. Specifically, as can be seen both in FIG. 6 and in the blowup of FIG. 7, the error signal ($I_{err}$) is substantially smaller over a large portion of the time for the power amplifier module that contains both types of compensation than for the power amplifier module that contains only feedback compensation.

Although the embodiments describe a Cartesian feedback loop (a feedback loop using analog Cartesian signals, the embodiments could equally well employ a polar (or other) feedback loop.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Those skilled in the art will recognize that a wide variety of modifications, alterations, and combinations can be made with respect to the above described embodiments without departing from the spirit and scope of the invention defined by the claims, and that such modifications, alterations, and combinations are to be viewed as being within the purview of the inventive concept. Thus, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

The invention claimed is:

1. A power amplifier module comprising:
   an analog feedback system containing one or more compensators and a power amplifier in a feedback loop having a feed-forward path between, and not including, one or more feedback signal combiners and the power amplifier; and
   a digital pre-distortion compensation system compensating for signals in cooperation with the analog feedback system, the digital pre-distortion compensation system injecting digital to analog (D/A) converted pre-distortion signals into the feed-forward path of the analog feedback system, the pre-distortion signals compensating for pre-determined non-linearities of the power amplifier.

2. The power amplifier module of claim 1, further comprising one or more -D/A converters (DACs) for converting signals passing between the analog feedback system and the digital pre-distortion system.

3. The power amplifier module of claim 2, further comprising a baseband generator generating quadrature reference signals, wherein:
   the feedback loop comprises:
      one or more first combiners to which demodulated quadrature signals sampled from an antenna are supplied,
      one or more loop compensators connected to the first combiners such that signals from the first combiners are supplied to the loop compensators, the loop compensators shaping a loop gain of the feedback loop, and
      one or more second combiners for combining outputs from the loop compensators and the D/A converted pre-distortion signals; and
   the pre-distortion compensation system comprises error tables coupled to the baseband generator, the error tables providing pre-determined estimated error signals based on the quadrature reference signals that compensate for the pre-determined power amplifier non-linearities, the error tables providing the pre-distortion signals, via DACs, to the second combiners.

4. The power amplifier module of claim 3, wherein:
   outputs from the second combiners are provided to the power amplifier via a modulator.

5. The power amplifier module of claim 4, wherein the baseband generator comprises an envelope calculator that calculates a radio-frequency (RF) envelope of the quadrature reference signals, the power amplifier module further comprising a tracking power supply connected to the baseband generator to which the RF envelope is supplied, the tracking power supply connected to the power amplifier, the tracking power supply providing a supply voltage that depends on the RF envelope to the power amplifier.

6. The power amplifier module of claim 5, wherein the power amplifier module further comprises a tracking power supply model filtering the RF envelope and supplying the filtered RF envelope to the error tables, the estimated error signals based on the filtered RF envelope in addition to the quadrature reference signals.

7. The power amplifier module of claim 1, wherein the digital pre-distortion compensation system is outside the analog feedback loop.

8. The power amplifier module of claim 1, the analog feedback loop further comprising a modulator in the feed-forward path of the feedback loop and a demodulator in a feed-back path of the feedback loop.

9. A power amplifier module comprising:
   an analog feedback system containing one or more first feedback combiners, one or more loop compensators, and a power amplifier in an analog feedback loop; and
   a digital pre-distortion compensation system compensating for power amplifier non-linearities in cooperation with the analog feedback system, the digital pre-distortion compensation system comprising one or more error tables, one or more filters, and one or more second combiners, the error tables coupled to the baseband generator and providing pre-determined estimated error signals based on the quadrature reference signals that compensate for the pre-determined power amplifier non-linearities, the error tables providing the pre-distortion signals to the second combiners via the filters;
   wherein the filters are configured to filter the estimated error signals to provide an inversion of a loop compensator transfer function of the analog feedback loop, wherein the second combiners are connected between the baseband generator and the first combiners, the second combiners connected with the filter such that reference signals from the baseband generator and signals from the filter are supplied to the second combiners via digital to analog converters (DACs).

10. A method of linearizing a power amplifier, the method comprising:
   providing feedback using an analog feedback loop to partially compensate for non-linearities of the power amplifier, the analog feedback loop including a feed-forward path between, and not including, a feedback signal combiner and the power amplifier; and
   providing digital pre-distortion compensation to additionally compensate for the non-linearities of the power amplifier in cooperation with the analog feedback loop, the digital pre-distortion compensation injecting digital to analog (D/A) converted pre-distortion signals into the feed-forward path of the analog feedback loop.

11. The method of claim 10, further comprising providing one or more digital to analog (D/A) converters (DACs) for converting the pre-distortion signals into analog form prior to injection into the feed-forward path of the analog feedback loop.

12. The method of claim 11, wherein providing the D/A converted pre-distortion signals comprises generating estimated error signals based on reference signals and pre-determined estimated error signals retrieved from one or more error tables, and providing the D/A converted estimated error signals to one or more combiners in the feed-forward path of the analog feedback loop.

13. The method of claim 12, further comprising:
   calculating a radio-frequency (RF) envelope of the reference signals; and
   providing a supply voltage to the power amplifier that depends on the RF envelope.

14. The method of claim 13, further comprising filtering the RF envelope and supplying the filtered RF envelope to the one or more error tables that provide the estimated error signals such that the estimated error signals are based on the filtered RF envelope in addition to the reference signals.

15. The method of claim 10, further comprising generating the pre-distortion signals outside the feedback loop.

16. The method of claim 10, further comprising demodulating an output of the power amplifier in a feed-back path of the feedback loop, and providing the demodulated signals to the feedback signal combiner.

17. A method of linearizing a power amplifier, the method comprising:
  providing feedback using an analog feedback loop to partially compensate for non-linearities of the power amplifier, the analog feedback loop including first feedback combiners, loop compensators, and a power amplifier; and
  providing digital pre-distortion compensation to additionally compensate for the non-linearities of the power amplifier in cooperation with the analog feedback loop, the digital pre-distortion compensation including one or more error tables, one or more filters, and one or more second combiners, the error tables coupled to the baseband generator and providing pre-determined estimated error signals based on the quadrature reference signals and compensating for the pre-determined power amplifier non-linearities, the error tables providing the pre-distortion signals to the second combiners via the filters;
  further comprising filtering, via the filters, the estimated error signals to provide an inversion of a loop compensator transfer function of the analog feedback loop to the second combiners as inverted estimated error signals, and
  wherein providing the digital pre-distortion further comprises combining, at the second combiners, reference signals from the baseband generator and the inverted estimated error signals and providing resultant signals to the first feedback combiners of the analog feedback loop via one or more digital to analog converters (DACs).

* * * * *

UNITED STATES PATENT AND TRADEMARK OFFICE
CERTIFICATE OF CORRECTION

PATENT NO. : 8,090,051 B2
APPLICATION NO. : 12/111593
DATED : January 3, 2012
INVENTOR(S) : Hoyerby et al.

Page 1 of 1

It is certified that error appears in the above-identified patent and that said Letters Patent is hereby corrected as shown below:

In Column 4, Line 52, delete "$Q_{out}.$" and insert -- $Q_{in}.$ --, therefor.

In Column 4, Line 55, delete "$Q_{out}$" and insert -- $Q_{in}$ --, therefor.

In Column 5, Line 17, delete "UFPTS" and insert -- UFTPS --, therefor.

In Column 5, Line 18, delete "UFPTS" and insert -- UFTPS --, therefor.

In Column 5, Line 21, delete "UFPTS" and insert -- UFTPS --, therefor.

In Column 5, Line 22, delete "UFPTS" and insert -- UFTPS --, therefor.

In Column 5, Line 27, delete "UFPTS" and insert -- UFTPS --, therefor.

In Column 7, Line 25, in Claim 2, delete "more -D/A" and insert -- more D/A --, therefor.

Signed and Sealed this
First Day of January, 2013

David J. Kappos
*Director of the United States Patent and Trademark Office*